US005945933A

United States Patent [19]
Kalkstein

[11] Patent Number: 5,945,933
[45] Date of Patent: Aug. 31, 1999

[54] ADAPTIVE PACKET COMPRESSION APPARATUS AND METHOD

[75] Inventor: Nir Kalkstein, Herzliya, Israel

[73] Assignee: Infit Ltd., Kfar Saba, Israel

[21] Appl. No.: 09/013,980

[22] Filed: Jan. 27, 1998

[51] Int. Cl.[6] .................................................. H03M 7/40
[52] U.S. Cl. .............................. 341/63; 341/65; 341/106
[58] Field of Search ................................ 341/50, 51, 87, 341/67, 106, 65

[56] References Cited

U.S. PATENT DOCUMENTS

| | | |
|---|---|---|
| 4,701,745 | 10/1987 | Waterworth . |
| 5,016,009 | 5/1991 | Whiting et al. . |
| 5,126,739 | 6/1992 | Whiting et al. . |
| 5,532,694 | 7/1996 | Mayers et al. ............................ 341/67 |
| 5,841,376 | 11/1998 | Hayashi ..................................... 341/51 |

OTHER PUBLICATIONS

Ziv et al., "A Universal Algorithm for Sequential Data Compression", *IEEE Trans. on Inf. Theory*, vol. IT–23, pp. 337–343, 1977.

Ziv et al, "Compression of Individual Sequence Via Variable Rate Coding", *IEEE Trans on Inf. Theory*, vol. I–T, pp. 530–536, 1977.

Huffman, D., "A Method for the Construction of Minimum Redundancey Codes", *Proc. IRE*, vol. 1098–1101, 1652

Williams, R.N., "An Extremely Fast Ziv–Lempel Data Compression Algorithm", *Proc. Data Compressioin Conf. DCC'91 Snowbird Utah, IEEE Computer Society Press, Los Alamitos*, CA, pp. 362–371, 1991.

Brent, R.P., "A Linear Algorithm for Data Compression", *The Australian Computer Journal*, vol. 19, pp. 64–68, 1987.

Shell, D.L., "A High Speed Sorting Procedure", Comm of the ACM, vol., 2, pp. 30–32, 1959.

Heaps, H.S., "Information Retrieval: Computation and Theoretical", Academic Press, NY, 1978.

Cormen et al, "Introduction to Algorithms", The MIT Press, Cambridge, MA, Ch 17, 1990.

*Primary Examiner*—Brian Young
*Attorney, Agent, or Firm*—Mark M. Friedman

[57] ABSTRACT

According to the present invention, there is provided a method for compressing each of a plurality of data packets to form a compressed packet for transmission by a communication device, the data packets being composed of a sequence of data elements and the data packets being stored on a first computer such that the method is performed by the first computer, the method comprising the steps of: (a) receiving one of the plurality of data packets designated as packet $P_m$; (b) parsing the packet $P_m$, such that the sequence of data elements of the packet $P_m$ is parsed into a sequence of parsed elements, each of the parsed elements having a form selected from the group consisting of a character, a pair of offset and length components, and a run length encoding consisting of a repetition factor component and a character component, and each of parsed elements and each of the components of the parsed elements having a frequency of occurrence; (c) selecting an encoding table from a historical array, the historical array including at least one encoding table from compression of at least one previously compressed data packet, the encoding table having been constructed according to the frequencies of occurrence of a plurality of parsed elements of the at least one previously compressed data packet, independent of data from the packet $P_m$.

45 Claims, 4 Drawing Sheets

*Fig. 1 - A Data Compression System*

Fig. 3 - H-Tree Array

ADAPTIVE PACKET COMPRESSION APPARATUS AND METHOD

FIELD AND BACKGROUND OF THE INVENTION

The present invention relates generally to data communication systems and methods, and particularly to data compression systems and methods which improve the efficiency of data transmission.

The vast and constantly increasing amount of data that is transmitted over communication lines and networks is a major incentive for the development of improved systems and methods for data compression. The overall performance of communication systems can be significantly increased with data compression techniques, since such techniques enable more information to be transmitted with fewer data bits over communication channels.

The performance of data compression techniques is mainly determined by three major factors. The first factor is the amount of compression achieved, or the ratio of the number of starting data bits to the number of bits produced. The second factor is the speed of compression, or the time needed to produce these bits. The third factor is the amount of computational overhead, in particular the requirement for computer resources such as memory. Generally, the following relation holds among these factors: the more compression achieved, the slower is the process and the more overhead required; conversely, the faster the process, the lesser compression amount achieved.

Normally, a particular compression technique is chosen according to the characteristics of the application. For example, "off-line" applications, which are not performed in real time, typically give up speed and overhead to achieve better compression. On the other hand, "on-line" applications, and in particular communication applications, typically settle for lesser compression to gain more speed.

Communication applications, or programs which facilitate the transmission of data on a communication channel, have certain characteristics which should be considered when choosing a technique for compression. For example, communication systems typically divide the transmitted data into blocks or "packets". If compression is desired, each packet should be compressed before transmission by the selected compression technique. Since communication channels between computers, particularly networks employing telephone system connections, have limited capacity, greater compression of the data increases the total amount of information which can be transmitted on the available bandwidth. On the other hand, since data compression for communication systems is typically needed on-line, the need for greater compression must be balanced against the increased amount of time and resources required for the compression process as the amount of compression increases. These competing requirements can be balanced by the choice of the proper data compression technique.

Data compression techniques encode the original data into a representation of fewer data bits, according to a translation data dictionary referred to herein as the "encoding table". The encoding table is typically derived from the data according to a selected scheme relating to various statistical information gathered therefrom, such as the frequencies of certain patterns in the data. Normally, the length of the bit representation in the encoding table for encoded data patterns is inversely related to the frequency of occurrence of these patterns.

Hereinafter, the term "text" refers to a stream of data bits which is provided as a unit to the compression algorithm, and includes but is not limited to, word data from a document, image data and other types of data. As noted above, the text can have features or characteristics such as internal patterns of data. The text can be compressed according to a number of different types of compression algorithms.

Hereinafter, the term "static compression algorithm" refers to algorithms which do not affect, update or otherwise change the encoding table for a given unit of text. Hereinafter, the term "dynamic compression algorithm" refers to algorithms for which the encoding table is constantly updated or changed according to features or characteristics of the text by a selected scheme. Hereinafter, the term "semi static compression algorithm" refers to algorithms for which the encoding table is occasionally updated or changed according to the text by a selected scheme. Hereinafter, the term "adaptive compression algorithm" refers to a dynamic or semi-static algorithm in which the encoding table is either constantly or occasionally updated or changed according to data pattern variations encountered in the text.

The last class of algorithms, adaptive algorithms, has a number of advantages. For example, these algorithms permit the encoding table to be adjusted to best reflect the data patterns in the text which is a "learning" capability. Furthermore, the encoding table need not necessarily be transmitted along with the encoded data, but rather can be fully rebuilt at the receiving end from the encoded data during decompression. Thus, this class of techniques is particularly well suited for data compression in a communication system.

Examples of such adaptive data compression techniques include the well-known Lempel-Ziv algorithms known, respectively, as LZ77 and LZ78, for constructing the encoding table (Ziv J., Lempel A.: A universal algorithm for sequential data compression, IEEE Transactions on Information Theory, Vol IT-23, (1977) pp. 337–343; Ziv J., Lempel A.: Compression of individual sequences via variable rate coding, IEEE Transactions on Information Theory, Vol IT-24, (1978) pp. 530–536). Waterworth (Waterworth J. R.: Data compression system, U.S. Pat. No. 4,701,745, Oct. 20, 1987) and Whiting et al. (Whiting D. L., George G. A., Ivey G. E.: Data compression apparatus and method, U.S. Pat. No. 5,016,009, May 14, 1991; Whiting D. L., George G. A., Ivey G. E.: Data compression apparatus and method, U.S. Pat. No. 5,126,739, Jun. 30, 1992) provide efficient implementations of the Lempel & Ziv LZ77 technique for identifying data patterns in the text. A similar fast implementation is given by Williams (Williams R. N., An extremely fast Ziv-Lempel data compression algorithm, Proceedings Data Compression Conference DCC'91, Snowbird, Utah, Apr. 8–11, 1991, IEEE Computer Society Press, Los Alamitos, Calif., pp. 362–371). In addition, Huffman (Huffman D.: A method for the construction of minimum redundancy codes, Proceedings IRE, Vol 40, (1952) pp. 1098–1101) provides an optimal encoding scheme. Finally, Brent (Brent R. P.: A linear algorithm for data compression, The Australian Computer Journal, Vol 19, (1987) pp. 64–68) provides a static technique that takes advantage of both LZ77 and the Huffman encoding scheme.

Although these well-known data compression techniques have been successfully employed, they have a number of disadvantages for communication systems. For example, the implementations of Whiting do not use statistical information from previous data packets to more efficiently compress current packets. Furthermore, the static technique of Brent requires the encoding table to be transmitted with the encoded data, thereby consuming valuable bandwidth. Some other methods of compression do not take advantage of the basic structure of data transmissions in communication systems, in which data are transmitted in packets rather than as a continuous stream. Thus, many of the currently available data compression techniques have significant disadvantages, particularly with regard to communication systems.

By contrast, the present invention provides significant improvements to the prior art in general, and for implementations relating to data communication in particular. First, in contrast to dynamic techniques which constantly update the encoding table, the semi-static technique provided by the present invention only occasionally updates the encoding table, thereby significantly improving the encoding speed. Second, the present invention features an improved implementation of the Huffman encoding, thereby gaining a significant increase of speed in exchange for slight or negligible degradation of the compression capacity. Third, the present invention features an improved encoding scheme which provides for achieving better compression.

The present invention therefore satisfies an unmet need for a method for data compression which is particularly suited for communication systems, which is adaptive to the characteristics of the transmitted data, which is rapid and yet which is able to significantly compress the data in order to maximize bandwidth of the communication system.

SUMMARY OF THE INVENTION

It is an objective of the present invention to provide an improved adaptive data compression system and method in general, and to improve the performance of data communication systems in particular, through the use of the features described hereinbelow.

According to the present invention, there is provided a method for compressing each of a plurality of data packets to form a compressed packet for transmission by a communication device, the data packets being composed of a sequence of data elements and the data packets being stored on a first computer such that the method is performed by the first computer, the method comprising the steps of: (a) receiving one of the plurality of data packets designated as packet $P_m$; (b) parsing the packet $P_m$, such that the sequence of data elements of the packet $P_m$ is parsed into a sequence of parsed elements, each of the parsed elements having a form selected from the group consisting of a character, a pair of offset and length components, and a run length encoding consisting of a repetition factor component and a character component, and each of parsed elements and each of the components of the parsed elements having a frequency of occurrence; (c) selecting an encoding table from a historical array, the historical array including at least one encoding table from compression of at least one previously compressed data packet, the encoding table having been constructed according to the frequencies of occurrence of a plurality of parsed elements of the at least one previously compressed data packet, independent of data from the packet $P_m$; (d) encoding the sequence of parsed elements according to the encoding table to form encoded data; (e) packaging the encoded data into the compressed packet; (f) constructing a historical frequency list of the frequencies of occurrence of the parsed elements; (g) constructing an additional encoding table according to the frequencies of occurrence of the parsed elements; and (h) storing the additional encoding table in the historical array.

Preferably, the packet $P_m$ is a first packet of the plurality of data packets and the encoding table in the historical array is constructed according to a preselected distribution. Also preferably, the encoding table includes a Huffman tree.

According to a preferred embodiment of the present invention, the encoding table includes a pair of Huffman trees, a first Huffman tree being constructed according to the frequencies of occurrence of: (a) the parsed elements having the form of the character; (b) the repetition factor component and the character component of the parsed elements having the form of the run length encoding; and (c) the length component of the parsed elements having the form of the pair of offset and length components; and a second Huffman tree being constructed according to the frequencies of occurrence of the offset component of the parsed elements having the form of the pair of offset and length components. More preferably, the step of encoding includes encoding each of the parsed elements according to the first Huffman tree if the parsed element has the form of the character or the run-length encoding, and alternatively, if the parsed element has the form of the pair of offset and length components, encoding the length component according to the first Huffman tree and the offset component according to the second Huffman tree.

According to another preferred embodiment of the present invention, the plurality of parsed elements are divided into a plurality of segments, each of the segments being encoded according to an encoding table from the historical array. More preferably, the method further comprises the step of: (i) arranging the elements of the list according to an arranging scheme, such that the historical frequency list is a ranked frequency list. Also more preferably, the arranging scheme is a sorting scheme. Also more preferably, the arranging scheme is a partial sorting scheme.

According to other preferred embodiments of the present invention, the encoded data is a compressed packet $C_m$, the method further comprising the step of decoding the compressed packet $C_m$ according to the encoding table. Preferably, the method further comprises the step of decoding the compressed packet $C_m$ according to the portion of the historical array, the portion being selected according to the designation. Preferably, the step (b) of parsing the packet $P_m$ is performed according to a greedy scheme. Also preferably, the step (b) of parsing the packet $P_m$ is performed according to a lookahead scheme.

According to still other preferred embodiments of the present invention, the compressed packet is transmitted from a first communication device on the first computer to a second communication device on a second computer. Preferably, the method further comprises the step of decoding the compressed packet $C_m$ according to the encoding table, the step of decoding being performed by the second computer.

According to another embodiment of the present invention, there is provided a method of decompressing each of a plurality of compressed packets to form a text string, the compressed packets being composed of encoded data and the compressed packets being stored on a first computer such that the method is performed by the first computer, the method comprising the steps of: (a) receiving one of the plurality of compressed packets designated as packet $C_m$; (b) decoding the packet $C_m$ according to an encoding table selected from an historical array including at least one encoding table from a previously decoded data packet to produce a sequence of parsed data elements, each of the parsed data elements having a form selected from the group consisting of a character, a pair of offset and length components, and a run length encoding and each of the parsed data elements having a frequency of occurrence; (c) converting the sequence of parsed data elements into the text string; (d) constructing a historical frequency list of the frequencies of occurrence of the parsed data elements; (e) constructing an additional encoding table according to the frequencies of the parsed data elements; and (f) storing the additional encoding table in the historical array. Preferably, the step of constructing the historical frequency list includes determining a weight of the frequencies of occurrence of the parsed data elements.

According to yet another embodiment of the present invention, there is provided a method for compressing a sequence of a plurality of data packets $P_1, P_2, P_3 \ldots$, each consisting of an arbitrary number of text characters, into a sequence of corresponding compressed data packets $C_1, C_2, C_3 \ldots$, the method comprising the steps of: (a) receiving a current packet $P_m$ of the sequence; (b) storing in a text history window a selected number of text characters of at least one most recently received input packet, including at least text characters forming the current packet $P_m$; (c) parsing the current packet $P_m$ in accordance with a scheme derived from the LZ77 technique and operating on the text history window, thereby converting the current packet $P_m$ into a sequence of at least one segment, each segment comprising a sequence of one or more parsed data items each having a form selected from the group consisting of a Character, an (Offset, Length) pair, and a run length encoding, the (Offset, Length) pair having an offset component and a length component, and the run length encoding having a repetition factor component and a character component, each of the data items and the components of the data items having an occurrence frequency relating to the number of times the parsed data item or the component of the parsed data item occurs in the sequence of parsed data items constructed for the current packet $P_m$; (d) substituting the parsed data items of each of the segments by encoded bit strings being extracted from a selected encoding table, the selected encoding table being selected from an array of historical encoding tables, the array including one or more encoding tables generated for selected previous packets, or, for the first packet, including at least one encoding table based on some predetermined distribution of the data items, the encoded bit strings being accompanied by an indicator designating the selected encoding table, thereby encoding the current packet $P_m$ into a compressed packet $C_m$ according to encoding tables generated on the basis of data that is independent of the current packet $P_m$; (e) providing an output including the compressed packet $C_m$; (f) updating a historical frequency list, using a representation of the occurrence frequencies of selected parsed data items in selected already processed packets including the current packet $P_m$, in preparation for processing subsequent packets; (g) generating a ranked historical frequency list by arranging the historical frequency list according to a selected arranging scheme; (h) generating an encoding table using the ranked historical frequency list in accordance with a scheme identical to or derived from the Huffman encoding technique; and (i) incorporating the generated encoding table in the array of historical encoding tables.

Preferably, each of the representations of the occurrence frequencies is derived from a selected function of at least the occurrence frequency of the selected parsed data item. Also preferably, the selected arranging scheme includes a sorting scheme. Also preferably, the selected arranging scheme includes a partial sorting scheme. Preferably, the parsing scheme includes a greedy parsing method. Alternatively and preferably, the parsing scheme includes a lookahead parsing method.

BRIEF DESCRIPTION OF THE DRAWINGS

The foregoing and other objects, aspects and advantages will be better understood from the following detailed description of a preferred embodiment of the invention with reference to the drawings, wherein.

BRIEF DESCRIPTION OF THE INVENTION

Figure 1:
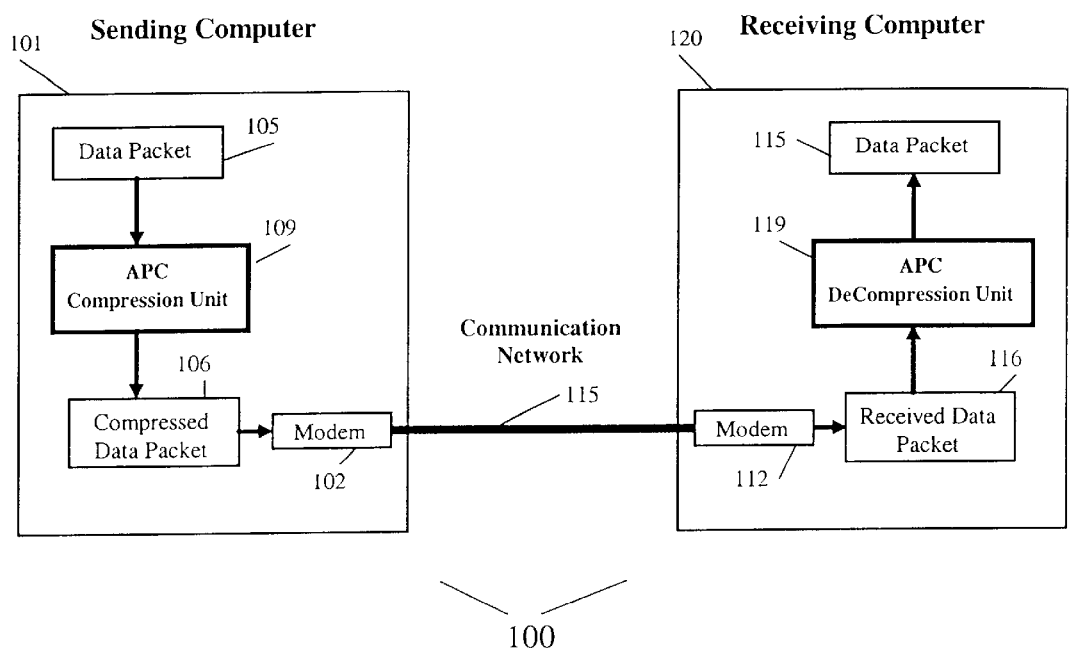
FIG. 1 shows an exemplary data compression system according to the present invention.

The present invention provides significant improvements to the prior art of data compression in general, and for implementations relating to data communication in particular. The present invention enhances the data transmission speed by providing an improved system and method for compressing the data to be transmitted, and for decompressing, i.e. restoring the compressed data after it has been received. The method of the present invention is an Adaptive, Packet oriented Compression technique and is referred to herein as "the APC technique" or just "the APC".

The APC technique belongs to the "lossless" class of data compression systems and methods, which fully preserve compressed data, though in a different format or representation. After "lossless" compression, the encoded data can be fully restored without loss of information. By contrast, "lossy" compression methods seek to achieve greater compression by the loss of a certain portion of the information. Thus, "lossless" compression methods are often more desirable, particularly for medical and legal documents.

According to the present invention, the text to be compressed may be received over a communication channel or otherwise presented in blocks or packets, each including an arbitrary number of data characters. Such a packet may be very small, only including tens to hundreds of characters. Preferably, each packet is compressed separately, without waiting for subsequent packets.

As each packet is compressed, a data dictionary is constructed according to the LZ77 algorithm. This data dictionary is composed of items, which can be in one of the following three forms.

The first form, and the most basic building block of the input text, is a "character", typically some 8-bit sequence such as ASCII or EBCDIC representations.

The second form is an "(Offset,Length) pair", in which a subsequent occurrence of a certain character sequence is replaced by a backward reference pointer to some earlier occurrence of that sequence in the text, indicating the location of the earlier occurrence (offset), and the number of characters to be copied (length).

For example, if the text is . . . xxxABCDxABCxx . . . , the second occurrence of ABC can be replaced by the pointer (5,3), indicating that once the string has been processed up to and including Dx, the subsequent characters can be reconstructed by going backwards 5 characters, and copying exactly 3 characters from the data.

The third form is a "Run Length Encoding" (RLE). A string of length n, for n>1, of repetitive identical characters can be replaced by a single occurrence of this character, preceded by the repetition factor n. For example, the seven consecutive "A's" in the text string xyzAAAAAAAxyz can be replaced by the designation "(7)A", where "(7)" is the repetition factor 7.

Once the encoding dictionary has been prepared, two Huffman trees (also referred to herein as H-trees) are constructed. The Huffman scheme is a method for constructing minimum redundancy code and is classically associated with a tree structure. However, the scheme could also be implemented by an array, a linked list, or a table for example. For the sake of clarity, the description herein focusses on Huffman trees, it being understood that this is for the purposes of discussion only and is not meant to be limiting in any way. The first H-tree will be subsequently referred to as Alpha and the second H-tree as Beta. These H-trees form the encoding table. The tree Alpha is constructed according to the occurrence frequencies of the parsed elements which have the form of a Character, the occurrence frequencies of the repetition factor from the parsed elements which have the form of RLE items, and the occurrence frequencies from the Length part of the parsed elements which have the form of (Offset,Length) pairs. Every RLE is therefore composed of a pair of dictionary items, both of which are encoded in tree Alpha. The tree Beta is constructed according to the occurrence frequency of the Offset part of the (Offset,Length) pairs.

The encoding phase is performed as follows. A Character is encoded according to tree Alpha. An (Offset,Length) pair is encoded in the following manner. First, the Length part is encoded according to tree Alpha, which also indicates that the next element to be encoded is the Offset part of the pair. The Offset part is then encoded according to tree Beta. For the RLE, both the repetition factor and the character are encoded according to tree Alpha.

For the first packet, a pair of H-trees, Alpha and Beta could be chosen which do not depend upon input data, but which are instead fixed in advance. For example, the pair could be based upon a uniform distribution, which assumes that all the elements appear with the same probability. As another example, the pair could be based upon a standard distribution of characters in English, obtainable from a reference such as "Information retrieval: Computational and theoretical aspects", by H. S. Heaps, Academic Press, New York (1978). A similar fixed H-tree pair must be used for decompression, as further described below.

As the elements forming the basis of the Huffman tree construction algorithm are known to the decoder while processing each packet, identical copies of both Huffman trees Alpha and Beta can be reconstructed at the receiving end without the transfer of the encoding tables. Furthermore, in contrast to the methods of Whiting (Whiting D. L., George G. A., Ivey G. E.: Data compression apparatus and method, U.S. Pat. No. 5,016,009, May 14, 1991; Whiting D. L., George G. A., Ivey G. E.: Data compression apparatus and method, U.S. Pat. No. 5,126,739, Jun. 30, 1992), there is no need to attach extra superfluous bits to the encoded data in order to distinguish between single Characters and (Offset, Length) pairs, thereby increasing the amount of information compressed within a given number of bits.

The encoding table contains information from an H-tree pair. Rather than discarding the encoding table of the current packet after processing the current packet, a number of encoding tables from a certain number of previously processed packets may be retained. The number of retained tables may be predetermined or user adjustable. The collection of retained encoding tables is therefore referred to herein as a "History" encoding table. The number of previously processed packets is hereinafter designated as the "packet history depth". By contrast to prior art compression methods which encode each packet according to a dynamically changing encoding table, the current packet is encoded according to the History encoding table, so that the method of the present invention is semi-static. This provides for more efficient utilization of the information already gathered for previous packets, such as better encoding of the (Offset, Length) pairs and RLE elements, and hence for better compression. Furthermore, the elimination of the frequent updates necessary for the dynamically changing encoding table leads to significant savings in processing time.

Preferably, the History encoding table is only updated once per packet. A temporary encoding table is preferably constructed separately for the current packet. After the encoding phase is completed, the History encoding table is updated according to this temporary table, thereby significantly increasing the encoding table updating speed and hence the process speed. For additional improvement in processing speed, a partial sorting scheme is preferably employed while constructing the Huffman trees. Such a scheme sacrifices slight or practically negligible compression capacity in exchange for a significant increase of processing speed.

DETAILED DESCRIPTION OF THE INVENTION

The method of the present invention is particularly suited for data compression for communication systems. Data communication systems normally transmit data in units called blocks or packets, each consisting of a plurality of Characters. Data compression systems operating in communication environments need therefore compress each packet before transmission, and decompress the compressed packets at the receiving end.

The method of the present invention, or "APC", is designed to accommodate communication systems, and as such it compresses data on a packet by packet basis. The packets can be of fixed or variable length. Each packet is compressed as it is presented to the compression system without the need to wait for subsequent packets.

The principles and operation of a method and a system for data compression according to the present invention may be better understood with reference to the drawings and the accompanying description, it being understood that these drawings are given for illustrative purposes only and are not meant to be limiting.

FIG. 1 schematically illustrates an exemplary implementation of the method and system of the present invention or APC, constructed and operative according to a preferred embodiment of the present invention. For the sake of clarity, only two computers are shown, it being understood that this is for illustrative purposes only and is not intended to be limiting.

A data communication system 100 is illustrated. Communication system 100 includes a sending computer 101 equipped with an APC compression unit 109 for compressing data and a communication device 102 for transmitting data. Communication device 102 can be a modem, as illustrated, or any other such communication device. However, the method of the present invention is not limited to data communication system 100, which is shown merely for illustrative purposes.

Data communication system 100 also includes a receiving computer 120 equipped with an APC decompression unit 119 for decompressing data and a communication device 112 for receiving data. Communication device 112 can be a modem, as illustrated, or may be any other such communication device. Communication device 102 and communication device 112 do not need to be identical.

Receiving computer 120 is connected to a sending computer 101 by a communication network 115 through which data is transmitted in the form of a plurality of data packets. An uncompressed data packet 105 is compressed by APC compression unit 109 in sending computer 101. APC compression unit 109 then outputs a compressed data packet 106. Compressed data packet 106 is then transmitted from communication device 102 over communication network 115 to communication device 112. Transmitted packet 106 is then a received packet 116, which is identical to transmitted packet 106. Received packet 116 is then decompressed by APC decompression unit 119, which outputs a decompressed packet 115. Decompressed packet 115 is identical to uncompressed packet 105. Decompressed packet 115 is then ready to be processed by receiving computer 120.

APC compression and decompression units 109 and 119 can be implemented as hardware, software, firmware or some combination. For example, APC compression and decompression units 109 and 119 can form part of the communication devices 102 and 112. Alternatively, APC compression and decompression units 109 and 119 can be operated by computers 101 and 120 as software. Optionally, different implementations of APC compression and decompression units 109 and 119 can be employed by computers 101 and 120.

Figure 2:
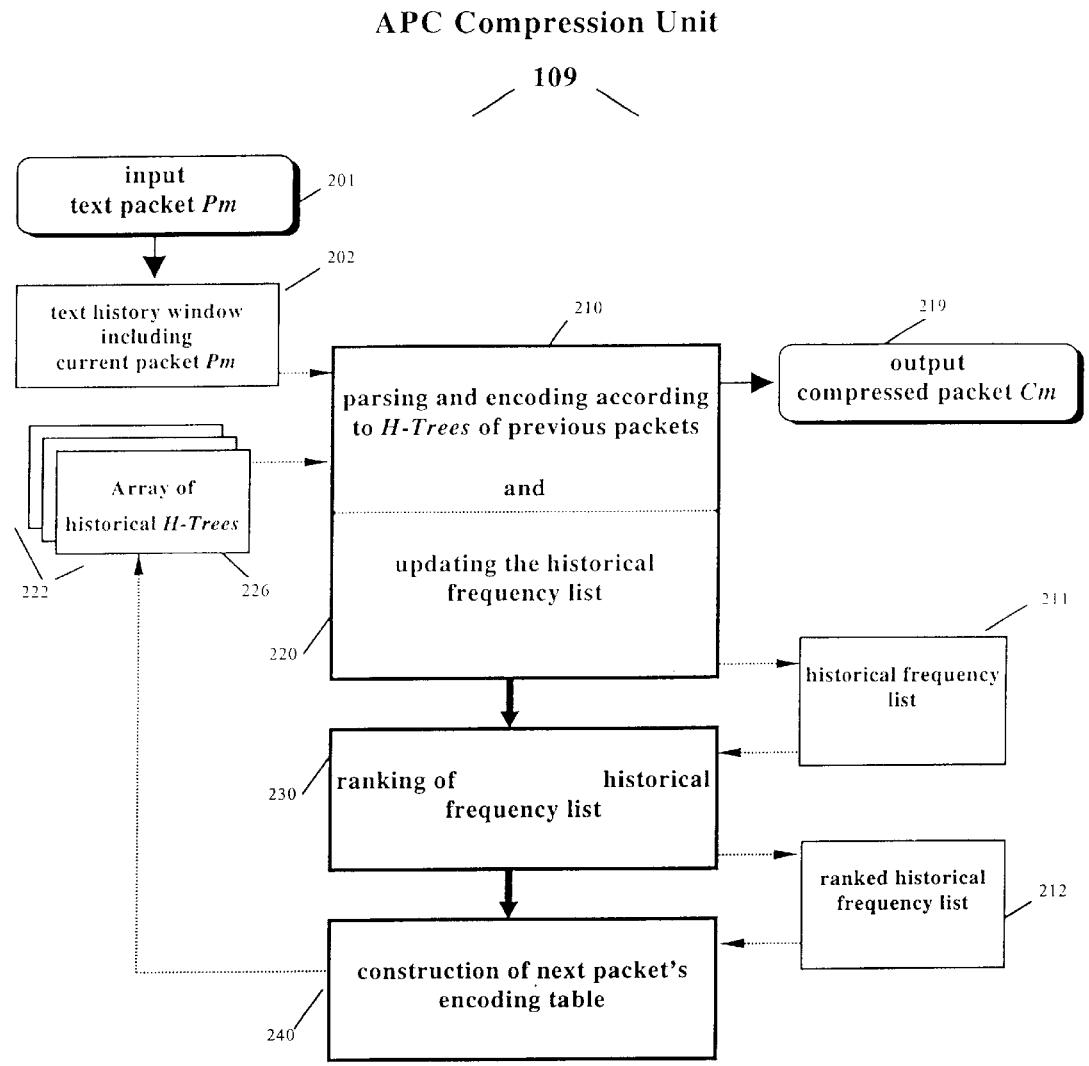
FIG. 2 is a schematic block diagram of a preferred compression unit according to the present invention.

FIG. 2 schematically illustrates an exemplary implementation of the method of the present invention as employed by APC compression unit 109 of FIG. 1. The compression process is shown for a packet $P_m$, which is one of an a priori unbounded sequence of packets $P_1$, $P_2$, $P_3$, . . . For the purposes of illustration, packets $P_1$ . . . $P_{m-1}$ are assumed to have already been processed by APC compression unit 109.

The APC compression unit 109 maintains the following data structures.

The first structure is a historical frequency list 211, a data dictionary which includes statistical information relating to the occurrence frequencies of the data items in some or all of the previously processed packets $P_1$, . . . , $P_{m-1}$.

The second structure is an array 222 of Alpha and Beta Huffman tree pairs, each pair including an encoding table constructed for some previously processed packets according to a procedure derived from Huffman's algorithm, as described in the "Brief Description of the Invention" previously.

The third structure is a text history window 202, which is a buffer of length w including the w most recent characters of the most recently processed packets, and at least the characters of the current packet $P_m$, i.e. $w \geq \text{length}(P_m)$.

In the illustrated method, an input text packet $P_m$ is first received by APC compression unit 109, as shown by block 201. Input text packet $P_m$ is then placed in the text history window as shown by block 202.

Next, the parsing and encoding step is shown in sub-block 210, in which the data items of the current packet $P_m$ are parsed using a scheme derived from the LZ77 method. The data items are parsed by constructing a data dictionary, as previously described in the "Brief Description of the Invention".

The parsing of data items is performed according to any variant of LZ77 such as Whiting's (Whiting D. L., George G. A., Ivey G. E.: Data compression apparatus and method, U.S. Pat. No. 5,016,009, May 14, 1991; Whiting D. L., George G. A., Ivey G. E.: Data compression apparatus and method, U.S. Pat. No. 5,126,739, Jun. 30, 1992).

The variant of LZ77 may further employ a greedy approach (see for example Cormen T. H., Leiserson C. E., Rivest R. L., Introduction to Algorithms, The MIT Press, Cambridge, Mass. (1990), Chapter 17), in which the next data item is chosen at each position as the one parsing the longest possible string. Alternatively, a scheme referred to herein as lookahead may be employed, according to which various parsing alternatives are examined as data items are parsed, and those schemes which produce smaller encodings are used.

For instance, suppose the given text is xxxABCDEFG and has already been parsed up to, but not including, the string ABC. Suppose further that the string ABCDE, but not the string ABCDEF, has occurred earlier in the text that has already been parsed. Then one possibility, according to the preferred variant of the LZ77 algorithm, is to continue the parsing by an (Offset, Length) pair, where Offset is the distance in characters from the current position to the previous occurrence of ABCDE, and Length=5. Denote this Offset as d1. However, before deciding to encode the characters following the current position as an (Offset, Length) pair, the proposed algorithm disclosed herein checks some alternative, namely encoding the single Character immediately following the current position (A in the given example) on its own and starting the (Offset, Length) encoding only for the subsequent characters. There are now two possibilities.

In the first possibility, the two alternatives parse strings of the same length. If the string parsed after the single character is just the suffix of the earlier string (BCDE in the example, to be encoded by some Offset d2, and Length=4), then the number of bits necessary to encode the pair (d1,5) is compared to the number of bits necessary to encode the single character plus the number of bits necessary to encode the pair (d2,4). The alternative requiring the smaller number of bits is then chosen.

In the second possibility, the two alternatives parse strings of different lengths, which may happen if, for example, the string BCDEFG did appear earlier, say, at some offset d3, even though the string ABCDE did not. The comparison of the number of bits necessary for the two encodings as above would not be accurate, since they do not replace the same number of text characters. Rather, the relative costs per character are compared as follows. Let n1, n2 and n3 denote, respectively, the number of bits necessary to encode the pair in the first alternative ((d1,5) in the example), a single character (A in the example) and the pair in the second alternative ((d3,6) in the example). Let m1 and m2 denote the number of characters parsed in the two alternatives (m1=5 and m2=7 in the example). Then the value of n1/m1, the number of bits necessary per character for the first alternative, is compared with (n2+n3)/m2, the corresponding number for the second alternative. The alternative corresponding to the smaller number is then chosen.

Many different alternative schemes with several parsed data items of any type could potentially be examined, depending on the specific implementation and the computer resources available. For example, additional alternatives could be included, such as encoding the next two, three or more characters first, and only then trying to parse the tail by an (Offset, Length) pair. As another example, two or more adjacent (Offset, Length) pairs could be differently parsed.

Once the data have been parsed, they are then encoded according to a selected H-tree pair of the array of Alpha and Beta H-trees. As described previously in the "Brief Description of the Invention", the tree Alpha is constructed according to the occurrence frequencies of the parsed elements which have the form of a Character, the occurrence frequencies of the repetition factor from the parsed elements which have the form of RLE items, and the occurrence frequencies from the Length part of the parsed elements which have the form of (Offset,Length) pairs. Every RLE is therefore composed of a pair of dictionary items, both of which are encoded in tree Alpha. The tree Beta is constructed according to the occurrence frequency of the Offset part of the (Offset,Length) pairs.

The encoding phase is performed by encoding the parsed data according to a selected H-tree pair from the H-tree array. To further optimize the compression, the current packet Pm is preferably further logically divided into segments, each segment comprising one or more parsed data items. The parsed elements of each segment are encoded according to the current H-tree pair of the array of H-tree pairs, but simultaneously, alternative encodings according to one or more other H-tree pairs of the array are probed. At the end of each segment, the costs of the segment encoding according to each of the H-tree pairs are compared. The pair yielding the lowest cost is chosen, and a short designation indicator (e.g., the index of the chosen H-tree pair in the array) is adjoined in front of the actual encoding of the data items in the segment.

For a given H-tree pair, the parsed data is encoded as follows. Each Character is encoded according to tree Alpha. An (Offset,Length) pair is encoded in the following manner. First, the Length part is encoded according to tree Alpha, which also indicates that the next element to be encoded is the Offset part of the pair. The Offset part is then encoded according to tree Beta. For the run-length encoding, both the repetition factor and the character to be repeated are encoded according to tree Alpha. The generated encoding is placed in an output buffer denoted as the output compressed packet $C_m$, as shown in block 219.

The array of H-trees which has been constructed for previously processed packets, remains static and unchanged during the entire encoding phase of the current packet $P_m$. This constitutes the semi-static characteristic of the APC method of the present invention, an important consequence of which is enabling decompression of the current compressed packet without the transfer of the encoding table with the compressed packet.

In the next step, the historical frequency list is updated, as depicted by sub-block 220, using the frequencies of data items in the current packet $P_m$, in preparation for processing of the subsequent packet $P_{m+1}$. The historical frequency list is shown in block 211 and is a data dictionary which includes statistical information relating to the occurrence frequencies of the data items in at least one, but preferably substantially all, of the previously processed packets $P_1, \ldots, P_{m-1}$. Preferably, instead of merely maintaining the occurrence frequencies of the data items in the historical frequency list, a weighting function can be used to reflect various factors relating to the data items including, but not limited to, statistical information relating to their occurrence frequencies, the distance of the packet numbers in which they recently occurred, and so forth.

An example for such a suitable weighting function follows: define freq(i,x) as the frequency of item x in the packet $P_i$, where $i \leq m$, and x is, for tree Alpha, either a character, a RLE or the Length part of an (Offset, Length) pair, and for tree Beta, the Offset part of an (Offset, Length) pair.

One could then define an predetermined integer constant k to be the packet history depth considered, and w(x) to be the weight of item x. The weight is then determined as follows. If m>k then the weight of item x for the current packet $P_m$ is:

$$w(x) \leftarrow \text{freq}(m,x) + \tfrac{1}{2}\text{freq}(m-1, x) + \tfrac{1}{4}\text{freq}(m-2, x) + \ldots + (\tfrac{1}{2})^k \text{freq}(m-k, x)$$

However, if $m \leq k$ then $$w(x) \leftarrow \text{freq}(m,x) + \tfrac{1}{2}\text{freq}(m-1, x) + \tfrac{1}{4}\text{freq}(m-2, x) + \ldots + (\tfrac{1}{2})^{m-1}\text{freq}(1, x)$$

In other words, although the frequency of item x in the current packet $P_m$ is taken without change, the frequencies in previous packets are multiplied by powers of ½, up to the k-th packet preceding the current one, if there are at least k preceding packets; otherwise, if there are less than k packets preceding the current one, this procedure is applied to all the preceding packets. Thus, as the occurrence of an item x is more distant in history, the impact on the weight is reduced.

Preferably, substantially all of the required tables freq(j, x), for $m-k \leq j \leq m$ are used for the determination of the weight. Alternatively and preferably, for greater ease of implementation, the following approximation could be substituted. After the parsing phase of the first packet $P_1$, the function is set such that $$w(x) \leftarrow \text{freq}(1,x)$$

For each of the subsequent packets $P_i$, the weight is updated after the parsing phase by $$w(x) \leftarrow \text{freq}(i,x) + \tfrac{1}{2}w(x)$$

thereby requiring only a single frequency table. The historical depth value k governing the number of previous packets considered for the function is implicitly given in this case by the bit precision of the actual computer used in the implementation.

Once the historical frequency list has been updated, the historical frequency list is ranked, as depicted by block 230. In this step, the items in the list are ranked or arranged according to a selected arranging scheme, preferably using a partial sort scheme as discussed below. The resulting output of this phase is a ranked historical frequency list shown in block 212.

According to Huffman (Huffman D.: A method for the construction of minimum redundancy codes, Proceedings IRE, Vol 40, (1952) pp. 1098–1101), the construction of the Huffman tree requires the list of the occurrence frequency data items to be a sorted list. The data items having higher occurrence frequencies are then assigned shorter codewords. The sorting process for n items, whose computational complexity is of the order n*log(n), normally consumes a considerable amount of processing time.

An underlying assumption of the APC method and system of the present invention is that since data items with a lower frequency of occurrence have a reduced impact on the overall compression of the data, the compression gain obtained by having these low-frequency items properly sorted is relatively smaller. Thus, for increased efficiency, preferably the ranked historical frequency list is only partially sorted, so that the number of sort iterations is limited, thereby significantly increasing the processing speed in exchange for slight or negligible compression loss.

Preferably, a sorting technique is chosen such that by performing a relatively small number b of iterations, the data items having the highest occurrence frequencies will be placed closer to the top of the list, i.e., will be ranked higher. An example of a suitable sorting technique is SHELLSORT (Shell D. L., A high-speed sorting procedure, Communications of the ACM, Vol 2, (1959) pp. 30–32).

In accordance with a preferred embodiment of the present invention, the number b of sort iterations can be passed as a parameter to the APC compression unit 109 and adjusted according to the characteristics of specific data types. In particular, b=0 might indicate no sorting at all, and b=∞ might indicate a request for a complete sort.

Lastly, the step of coding table construction is performed as depicted by block 240, in which a pair of Alpha and Beta H-trees is constructed, according to the ranked historical frequency list and is ready for the processing of the subsequent packet $P_{m+1}$, if any. The pair is then placed in array 222 as pair 226.

Figure 3:
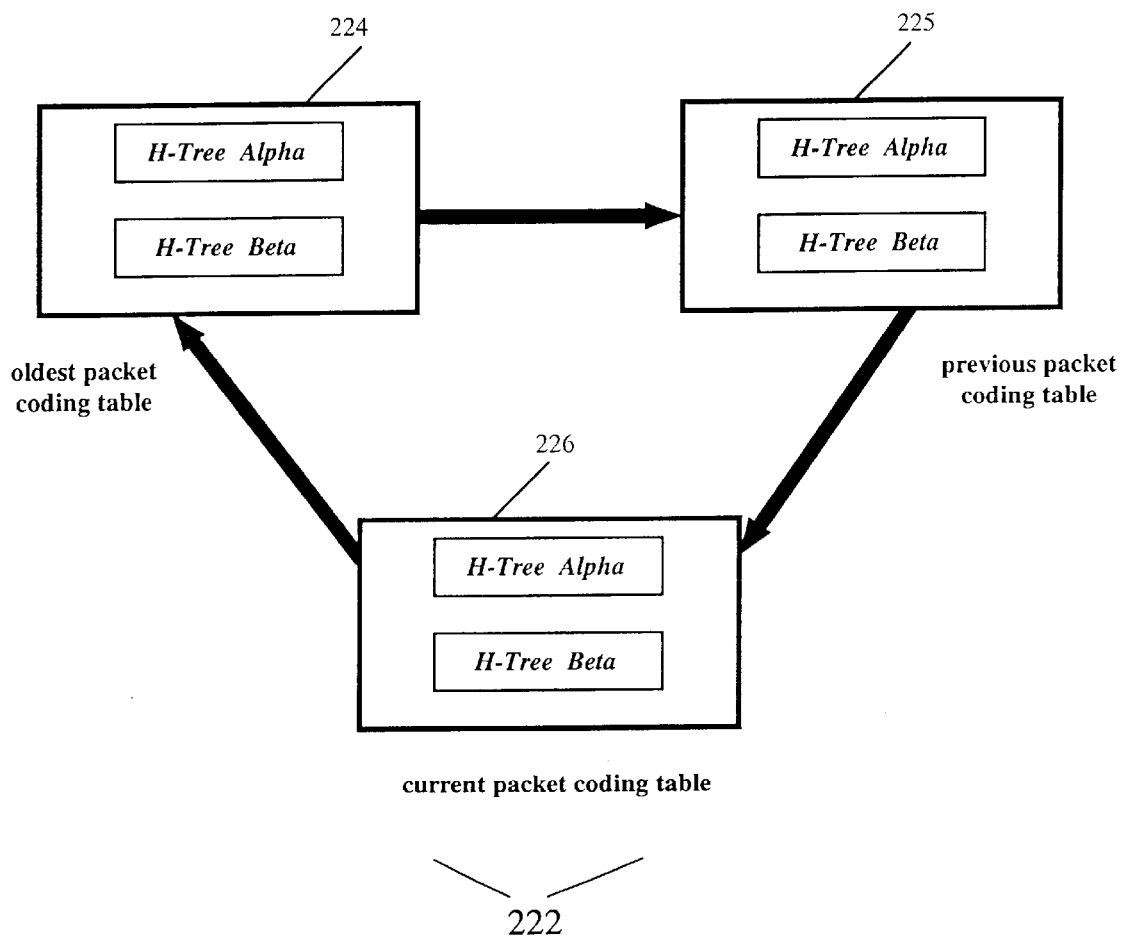
FIG. 3 is an illustrative H-Tree array according to the present invention.

FIG. 3 illustrates an exemplary array of Alpha and Beta H-tree pairs in more detail, constructed and operative according to a preferred embodiment of the present invention. Three array elements 224, 225 and 226 are illustrated, it being understood that the number of array elements shown is not intended to be limiting. Each array element is an Alpha and Beta H-tree pair, which reflects the encoding table constructed for a previously processed packet, or for some preselected fixed distribution which does not necessarily relate to the given text. The number t of such historical H-tree pairs can range from one to some arbitrarily large number as can be accommodated by available computer resources. For FIG. 3, t=3.

In accordance with a preferred embodiment of the present invention, this number t can be passed as a parameter to the APC compression unit 109 and adjusted according to specific implementation constraints. Preferably, array 222 of H-tree pairs can be implemented, for efficiency reasons, as a cyclic linked list of H-tree pairs. In such a list, each element such as pair 224 points to a more recent element such as 225, and the list pointer points to the current or most recent H-tree pair element 226. In turn, pair element 226 points to the 'oldest' pair element 224. As newer elements are added, the list pointer is adjusted to point to the most recently added element, which becomes the current element.

As noted previously, one advantage of the method and system of the present invention is that the encoding tables do not need to be transferred with the encoded data since the elements forming the basis of the encoding tables are known to the decoder.

Figure 4:
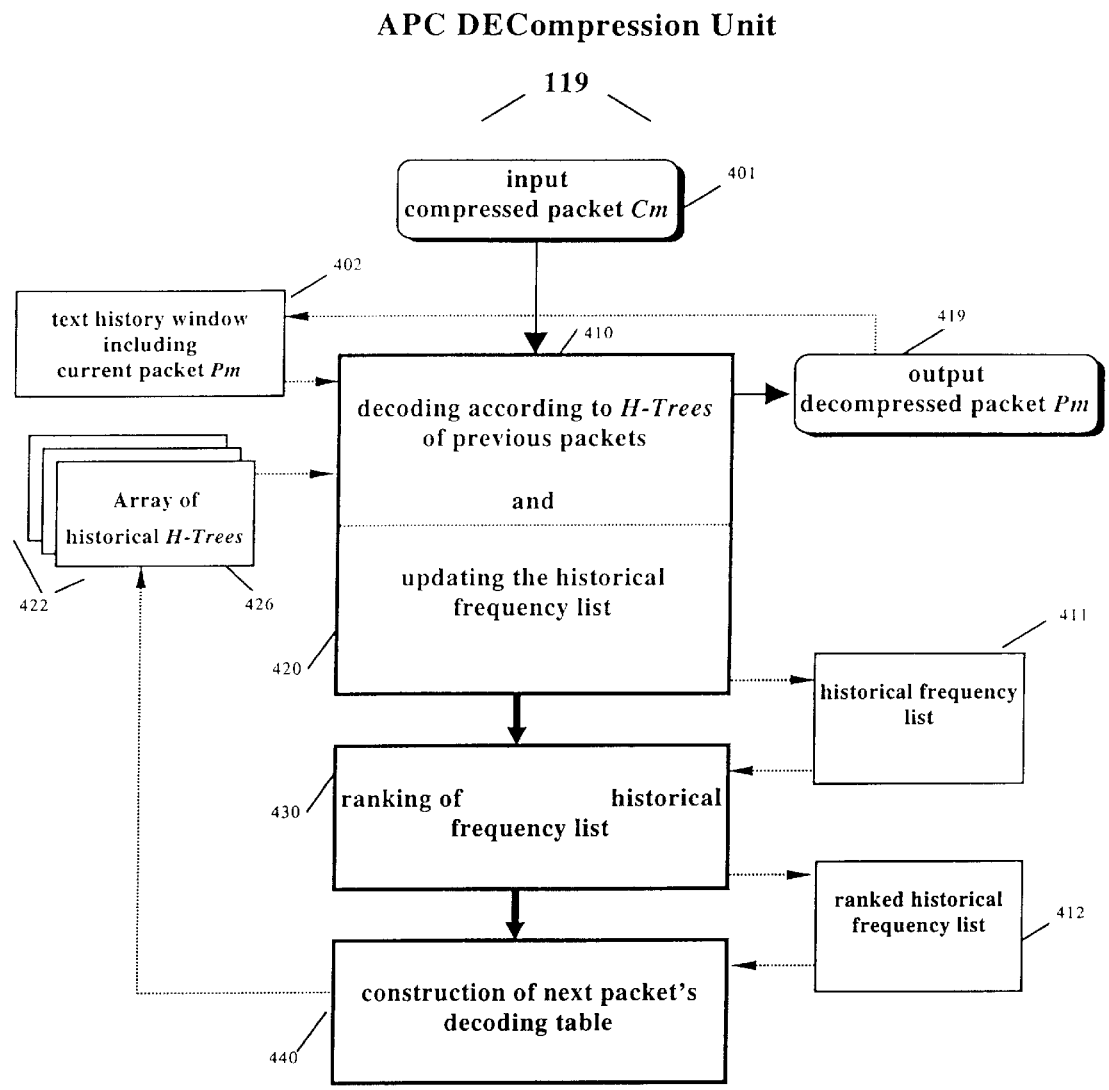
FIG. 4 is a schematic block diagram of a preferred decompression unit according to the present invention.

Reference is now made to FIG. 4, which depicts a block diagram of the method employed by APC decompression unit 119 of FIG. 1, illustrative of the decompression process as performed for the received compressed packet $C_m$ of FIG. 2 at the receiving computer 120. This method is an obvious reversal of the compression process. To start the decompression process, the same fixed pair of Alpha and Beta H-trees should be used as for the compression process. A brief description of these H-trees as used for compression is described in a "Brief Description of the Invention".

In the illustrated method, a compressed packet $C_m$ is first received by APC decompression unit 119, as shown by block 401. Next, the input compressed packet $C_m$ is decoded according to the array of H-tree pairs from previously decompressed packets, as shown in sub-block 410. Decoding is performed with the specific H-tree pair designated by the H-tree index bits appended to each segment within the received encoded data.

The generated decoded data items are then converted according to a scheme derived from the LZ77 technique, into a sequence of characters which are placed in an output buffer denoted as the output decompressed packet $P_m$, as shown in block 419. The output data is then placed in a text history window as shown by block 402. Similarly to FIG. 2, the text history window is a buffer of length w including the w most recent characters of the most recently processed packets, and at least the decoded characters from the current output decompressed packet $P_m$, such that w≧length ($P_m$).

After the data has been decoded, the historical frequency list of block 411 is updated, as shown in block 430. The historical frequency list is a data dictionary which includes statistical information relating to the occurrence frequencies of the data items in some or all of the previously decompressed packets $C_1, \ldots, C_{m-1}$.

The decoding tables are the array of H-trees shown in block 422, and are constructed in a manner which is substantially identical or functionally equivalent to that employed by the compression process of FIG. 2 for constructing the array of H-trees shown in block 222. The decoding tables are constructed in preparation for the decoding of the subsequent compressed packet $C_{m+1}$. Identical or equivalent weighting functions and ranking methods are employed as described for FIG. 2, thereby effectively mirroring the construction process of the compression unit 109 encoding tables. This eliminates the need for transfer of the encoding tables along with the encoded data. The tables remain static and unchanged during the entire decoding step 410 of each current packet $C_m$.

Although a few embodiments have been illustrated, modifications to these embodiments could be made without departing from the spirit of the present invention. For example, in the embodiment depicted by FIG. 2, one could first construct the coding table entry 226 and only thereafter perform the parsing and encoding step 210, thereby constructing the coding table only if a packet has been received.

Another example of a possible modification can be given for the ranking step as depicted by block 230 of FIG. 2, where rather than arranging or partially sorting the historical frequency list, a selected number of the items on the list can be provided in the desired order to the encoding table generation step depicted by block 240.

Also, the present invention could be implemented in other applications which do not relate to data communication such as a part of a software utility or an operating system offering file compression or real time data compression such as the PKZIP™ program of PKWARE™ or the MS-DOS DoubleSpace™ or DriveSpace™ programs of Microsoft™.

While the present invention has been described with reference to a few specific embodiments, the description is illustrative of the invention and should not be considered as limiting the invention. It is appreciated that various modifications could be made to the embodiments described hereinabove by a person skilled in the art, without departing from the scope and spirit as disclosed of the present invention.

What we claim is:

1. A method for compressing each of a plurality of data packets to form a compressed packet for transmission by a communication device, the data packets being composed of a sequence of data elements and the data packets being stored on a first computer such that the method is performed by the first computer, the method comprising the steps of:

(a) receiving one of said plurality of data packets designated as packet $P_m$;

(b) parsing said packet $P_m$, such that the sequence of data elements of said packet $P_m$ is parsed into a sequence of parsed elements, each of said parsed elements having a form selected from the group consisting of a character, a pair of offset and length components, and a run length encoding consisting of a repetition factor component and a character component, and each of parsed elements and each of said components of said parsed elements having a frequency of occurrence;

(c) selecting an encoding table from a historical array, said historical array including at least one encoding table from compression of at least one previously compressed data packet, said encoding table having been constructed according to the frequencies of occurrence of a plurality of parsed elements of said at least one previously compressed data packet, independent of data from said packet $P_m$;

(d) encoding said sequence of parsed elements according to said encoding table to form encoded data;

(e) packaging said encoded data into the compressed packet;

(f) constructing a historical frequency list of the frequencies of occurrence of said parsed elements;

(g) constructing an additional encoding table according to the frequencies of occurrence of said parsed elements; and (h) storing said additional encoding table in said historical array.

2. The method of claim 1, wherein said packet Pm is a first packet of the plurality of data packets and said encoding table in said historical array is constructed according to a preselected distribution.

3. The method of claim 1, wherein said encoding table includes a Huffman tree.

4. The method of claim 1, wherein said encoding table includes a pair of Huffman trees, a first Huffman tree being constructed according to the frequencies of occurrence of:

(a) said parsed elements having said form of said character;

(b) said repetition factor component and said character component of said parsed elements having said form of said run length encoding; and (c) said length component of said parsed elements having said form of said pair of offset and length components;

and a second Huffman tree being constructed according to the frequencies of occurrence of said offset component of said parsed elements having said form of said pair of offset and length components.

5. The method of claim 4, wherein said step of encoding includes encoding each of said parsed elements according to said first Huffman tree if said parsed element has said form of said character or said run-length encoding, and alternatively, if said parsed element has said form of said pair of offset and length components, encoding said length component according to said first Huffman tree and said offset component according to said second Huffman tree.

6. The method of claim 1, wherein said plurality of parsed elements are divided into a plurality of segments, each of said segments being encoded according to an encoding table from said historical array.

7. The method of claim 6, further comprising the step of:

(i) arranging said elements of said list according to an arranging scheme, such that said historical frequency list is a ranked frequency list.

8. The method of claim 7, wherein said arranging scheme is a sorting scheme.

9. The method of claim 7, wherein said arranging scheme is a partial sorting scheme.

10. The method of claim 1, wherein said step of constructing said historical frequency list includes determining a weight of said frequency of occurrence of the data elements.

11. The method of claim 1, further comprising the step of:

(i) arranging said elements of said list according to an arranging scheme, such that said historical frequency list is a ranked frequency list.

12. The method of claim 11, wherein said arranging scheme is a sorting scheme.

13. The method of claim 11, wherein said arranging scheme is a partial sorting scheme.

14. The method of claim 1, wherein said encoded data is a compressed packet $C_m$, the method further comprising the step of decoding said compressed packet $C_m$ according to said encoding table.

15. The method of claim 6, wherein the compressed packet is a compressed packet $C_m$, further comprising the step of decoding said compressed packet $C_m$ according to said portion of said historical array, said portion being selected according to said designation.

16. The method of claim 1, wherein said step (b) of parsing said packet $P_m$ is performed according to a greedy scheme.

17. The method of claim 1, wherein said step (b) of parsing said packet $P_m$ is performed according to a lookahead scheme.

18. The method of claim 1, wherein the compressed packet is transmitted from a first communication device on the first computer to a second communication device on a second computer.

19. The method of claim 18, further comprising the step of decoding said compressed packet $C_m$ according to said encoding table, said step of decoding being performed by said second computer.

20. A method of decompressing each of a plurality of compressed packets to form a text string, the compressed packets being composed of encoded data and the compressed packets being stored on a first computer such that the method is performed by the first computer, the method comprising the steps of:

(a) receiving one of said plurality of compressed packets designated as packet $C_m$;

(b) decoding said packet $C_m$ according to an encoding table selected from an historical array including at least one encoding table from a previously decoded data packet to produce a sequence of parsed data elements, each of said parsed data elements having a form selected from the group consisting of a character, a pair of offset and length components, and a run length encoding and each of said parsed data elements having a frequency of occurrence;

(c) converting said sequence of parsed data elements into the text string;

(d) constructing a historical frequency list of the frequencies of occurrence of said parsed data elements;

(e) constructing an additional encoding table according to the frequencies of said parsed data elements; and (f) storing said additional encoding table in said historical array.

21. The method of claim 20, wherein said step of constructing said historical frequency list includes determining a weight of the frequencies of occurrence of said parsed data elements.

22. A method for compressing a sequence of a plurality of data packets $P_1, P_2, P_3 \ldots$, each consisting of an arbitrary number of text characters, into a sequence of corresponding compressed data packets $C_1, C_2, C_3 \ldots$, the method comprising the steps of:

(a) receiving a current packet $P_m$ of said sequence;

(b) storing in a text history window a selected number of text characters of at least one most recently received input packet, including at least text characters forming said current packet $P_m$;

(c) parsing said current packet $P_m$ in accordance with a scheme derived from the LZ77 technique and operating on said text history window, thereby converting said current packet $P_m$ into a sequence of at least one segment, each segment comprising a sequence of one or more parsed data items each having a form selected from the group consisting of a Character, an (Offset, Length) pair, and a run length encoding, said (Offset, Length) pair having an offset component and a length component, and said run length encoding having a repetition factor component and a character component, each of said data items and said components of said data items having an occurrence frequency relating to the number of times said parsed data item or said component of said parsed data item occurs in said sequence of parsed data items constructed for said current packet $P_m$;

(d) substituting said parsed data items of each of said segments by encoded bit strings being extracted from a selected encoding table, said selected encoding table being selected from an array of historical encoding tables, said array including one or more encoding tables generated for selected previous packets, or, for the first packet, including at least one encoding table based on some predetermined distribution of the data items, said encoded bit strings being accompanied by an indicator designating said selected encoding table, thereby encoding the current packet $P_m$ into a compressed packet $C_m$ according to encoding tables generated on the basis of data that is independent of said current packet $P_m$;

(e) providing an output including said compressed packet $C_m$;

(f) updating a historical frequency list, using a representation of said occurrence frequencies of selected parsed data items in selected already processed packets including said current packet $P_m$, in preparation for processing subsequent packets;

(g) generating a ranked historical frequency list by arranging said historical frequency list according to a selected arranging scheme;

(h) generating an encoding table using said ranked historical frequency list in accordance with a scheme identical to or derived from the Huffman encoding technique; and (i) incorporating said generated encoding table in said array of historical encoding tables.

23. The method of claim 22, wherein each of said representations of said occurrence frequencies is derived from a selected function of at least the occurrence frequency of said selected parsed data item.

24. The method of claim 22, wherein said selected arranging scheme includes a sorting scheme.

25. The method of claim 23, wherein said selected arranging scheme includes a sorting scheme.

26. The method of claim 22, wherein said selected arranging scheme includes a partial sorting scheme.

27. The method of claim 23, wherein said selected arranging scheme includes a partial sorting scheme.

28. The method of claim 22, wherein said parsing scheme includes a greedy parsing method.

29. The method of claim 23, wherein said parsing scheme includes a greedy parsing method.

30. The method of claim 24, wherein said parsing scheme includes a greedy parsing method.

31. The method of claim 25, wherein said parsing scheme includes a greedy parsing method.

32. The method of claim 26, wherein said parsing scheme includes a greedy parsing method.

33. The method of claim 27, wherein said parsing scheme includes a greedy parsing method.

34. The method of claim 22, wherein said parsing scheme includes a lookahead parsing method.

35. The method of claim 23, wherein said parsing scheme includes a lookahead parsing method.

36. The method of claim 24, wherein said parsing scheme includes a lookahead parsing method.

37. The method of claim 25, wherein said parsing scheme includes a lookahead parsing method.

38. The method of claim 26, wherein said parsing scheme includes a lookahead parsing method.

39. The method of claim 27, wherein said parsing scheme includes a lookahead parsing method.

40. The method of claim 28, wherein said parsing scheme includes a lookahead parsing method.

41. The method of claim 29, wherein said parsing scheme includes a lookahead parsing method.

42. The method of claim 30, wherein said parsing scheme includes a lookahead parsing method.

43. The method of claim 31, wherein said parsing scheme includes a lookahead parsing method.

44. The method of claim 32, wherein said parsing scheme includes a lookahead parsing method.

45. The method of claim 33, wherein said parsing scheme includes a lookahead parsing method.

* * * * *